(12) United States Patent
Carlisle et al.

(10) Patent No.: US 7,285,766 B2
(45) Date of Patent: Oct. 23, 2007

(54) OPTICAL POSITIONING DEVICE HAVING SHAPED ILLUMINATION

(75) Inventors: Clinton B. Carlisle, Palo Alto, CA (US); Jahja I. Trisnadi, Cupertino, CA (US); Charles B. Roxlo, Saratoga, CA (US); David A. Lehoty, Mt. View, CA (US)

(73) Assignee: Silicon Light Machines Corporation, San Jose, CA (US)

( * ) Notice: Subject to any disclaimer, the term of this patent is extended or adjusted under 35 U.S.C. 154(b) by 125 days.

(21) Appl. No.: 11/129,967

(22) Filed: May 16, 2005

(65) Prior Publication Data

US 2005/0258347 A1 Nov. 24, 2005

Related U.S. Application Data

(60) Provisional application No. 60/573,394, filed on May 21, 2004, provisional application No. 60/573,075, filed on May 21, 2004.

(51) Int. Cl.
  *G01B 9/02* (2006.01)
  *G09G 5/08* (2006.01)
(52) U.S. Cl. .................. 250/221; 356/498; 345/166
(58) Field of Classification Search ............... 250/221, 250/208.1, 226; 345/157–169; 356/498
See application file for complete search history.

(56) References Cited

U.S. PATENT DOCUMENTS

| | | | |
|---|---|---|---|
| 3,922,093 A | 11/1975 | Dandliker et al. | |
| 4,546,347 A | 10/1985 | Kirsch | |
| 4,799,055 A | 1/1989 | Nestler et al. | |
| 5,086,197 A * | 2/1992 | Liou | 178/18.09 |
| 5,288,993 A | 2/1994 | Bidiville et al. | |
| 5,345,527 A | 9/1994 | Lebby et al. | |
| 5,473,344 A | 12/1995 | Bacon et al. | |
| 5,578,813 A | 11/1996 | Allen et al. | |
| 5,606,174 A | 2/1997 | Yoshimura et al. | |
| 5,644,139 A | 7/1997 | Allen et al. | |
| D382,550 S | 8/1997 | Kaneko et al. | |
| D385,542 S | 10/1997 | Kaneko et al. | |
| 5,703,356 A | 12/1997 | Bidiville et al. | |
| 5,729,008 A | 3/1998 | Blalock et al. | |
| 5,729,009 A | 3/1998 | Dandliker et al. | |
| 5,781,229 A | 7/1998 | Zediker et al. | |

(Continued)

OTHER PUBLICATIONS

R. E. Kalman, "A New Approach to Linear Filtering and Prediction Problems", Transactions of the ASME-Journal of Basic Engineering, 82 (Series D); Copyright 1960, ASME, pp. 35-45, Research Institute for Advanced Study, Baltimore, MD.

(Continued)

*Primary Examiner*—Georgia Epps
*Assistant Examiner*—Tony Ko
(74) *Attorney, Agent, or Firm*—Okamoto & Benedicto LLP

(57) ABSTRACT

One embodiment relates to an optical displacement sensor for sensing relative movement between a data input device and a surface by determining displacement of optical features in a succession of frames. The sensor includes an illuminator and a detector. The illuminator has a light source and illumination optics to illuminate a portion of the surface with a planar phase-front. The detector has a plurality of photosensitive elements and imaging optics. The illuminator and the detector are configured such that the illuminated portion of the surface is less than fifty percent larger than a field of view of the photosensitive elements of the detector. Other embodiments are also described.

14 Claims, 4 Drawing Sheets

U.S. PATENT DOCUMENTS

| | | |
|---|---|---|
| 5,786,804 A | 7/1998 | Gordon |
| 5,825,044 A | 10/1998 | Allen et al. |
| 5,854,482 A | 12/1998 | Bidiville et al. |
| 5,907,152 A | 5/1999 | Dandliker et al. |
| 5,963,197 A | 10/1999 | Bacon et al. |
| 5,994,710 A | 11/1999 | Knee et al. |
| 6,031,218 A | 2/2000 | Piot et al. |
| 6,037,643 A | 3/2000 | Knee |
| 6,057,540 A | 5/2000 | Gordon et al. |
| 6,097,371 A | 8/2000 | Siddiqui et al. |
| 6,151,015 A | 11/2000 | Badyal et al. |
| 6,172,354 B1 | 1/2001 | Adan et al. |
| 6,225,617 B1 | 5/2001 | Dandliker et al. |
| 6,233,368 B1 | 5/2001 | Badyal et al. |
| 6,281,881 B1 | 8/2001 | Siddiqui et al. |
| 6,281,882 B1 | 8/2001 | Gordon et al. |
| 6,326,950 B1 | 12/2001 | Liu |
| 6,330,057 B1 | 12/2001 | Lederer et al. |
| 6,351,257 B1 | 2/2002 | Liu |
| 6,396,479 B2 | 5/2002 | Gordon |
| 6,421,045 B1 | 7/2002 | Venkat et al. |
| 6,424,407 B1 | 7/2002 | Kinrot et al. |
| 6,433,780 B1 | 8/2002 | Gordon et al. |
| 6,452,683 B1 | 9/2002 | Kinrot et al. |
| 6,455,840 B1 | 9/2002 | Oliver et al. |
| D464,352 S | 10/2002 | Kerestegian |
| 6,462,330 B1 | 10/2002 | Venkat et al. |
| 6,476,970 B1 | 11/2002 | Smith |
| 6,529,184 B1 | 3/2003 | Julienne |
| 6,585,158 B2 | 7/2003 | Norskog |
| 6,603,111 B2 | 8/2003 | Dietz et al. |
| 6,621,483 B2 | 9/2003 | Wallace et al. |
| 6,642,506 B1 | 11/2003 | Nahum et al. |
| 6,657,184 B2 | 12/2003 | Anderson et al. |
| 6,664,948 B2 | 12/2003 | Crane et al. |
| 6,674,475 B1 | 1/2004 | Anderson |
| 6,677,929 B2 | 1/2004 | Gordon et al. |
| 6,703,599 B1 | 3/2004 | Casebolt et al. |
| 6,737,636 B2 | 5/2004 | Dietz et al. |
| 6,774,351 B2 | 8/2004 | Black |
| 6,774,915 B2 | 8/2004 | Rensberger |
| 6,795,056 B2 | 9/2004 | Norskog et al. |
| 6,809,723 B2 | 10/2004 | Davis |
| 6,819,314 B2 | 11/2004 | Black |
| 6,823,077 B2 | 11/2004 | Dietz et al. |
| 7,045,763 B2 * | 5/2006 | Ballard ..................... 250/221 |
| 7,116,427 B2 * | 10/2006 | Baney ........................ 356/498 |
| 7,138,620 B2 | 11/2006 | Trisnadi et al. |
| 2002/0130835 A1 | 9/2002 | Brosnan |
| 2002/0158300 A1 | 10/2002 | Gee |
| 2002/0190953 A1 | 12/2002 | Gordon et al. |
| 2003/0034959 A1 | 2/2003 | Davis et al. |
| 2003/0058506 A1 | 3/2003 | Green et al. |
| 2003/0142288 A1 | 7/2003 | Kinrot et al. |
| 2004/0084610 A1 | 5/2004 | Leong et al. |
| 2004/0189593 A1 | 9/2004 | Koay |
| 2005/0024336 A1 | 2/2005 | Xie et al. |
| 2005/0024623 A1 | 2/2005 | Xie et al. |
| 2005/0083303 A1 | 4/2005 | Schroeder et al. |

* cited by examiner

OPTICAL POSITIONING DEVICE HAVING SHAPED ILLUMINATION

CROSS-REFERENCE TO RELATED APPLICATIONS

The present application claims the benefit of U.S. provisional application No. 60/573,394, entitled "Optical position sensing device having shaped illumination," filed May 21, 2004, by inventors Clinton B. Carlisle, Jahja I. Trisnadi, Charles B. Roxlo, and David A. LeHoty. The disclosure of the aforementioned U.S. provisional application is hereby incorporated by reference in its entirety.

The present application also claims the benefit of U.S. provisional application No. 60/573,075, entitled "Optical position sensing device having a detector array using different combinations of shared interlaced photosensitive elements," filed May 21, 2004, by inventors David A. LeHoty, Douglas A. Webb, Charles B. Roxlo, Clinton B. Carlisle, and Jahja I. Trisnadi. The disclosure of the aforementioned U.S. provisional application is hereby incorporated by reference in its entirety.

TECHNICAL FIELD

The present invention relates generally to an Optical Positioning Device (OPD), and methods of sensing movement using same.

BACKGROUND OF THE INVENTION

Pointing devices, such as computer mice or trackballs, are utilized for inputting data into and interfacing with personal computers and workstations. Such devices allow rapid relocation of a cursor on a monitor, and are useful in many text, database and graphical programs. A user controls the cursor, for example, by moving the mouse over a surface to move the cursor in a direction and over distance proportional to the movement of the mouse. Alternatively, movement of the hand over a stationary device may be used for the same purpose.

Computer mice come in both optical and mechanical versions. Mechanical mice typically use a rotating ball to detect motion, and a pair of shaft encoders in contact with the ball to produce a digital signal used by the computer to move the cursor. One problem with mechanical mice is that they are prone to inaccuracy and malfunction after sustained use due to dirt accumulation, and such. In addition, the movement and resultant wear of the mechanical elements, particularly the shaft encoders, necessarily limit the useful life of the device.

One solution to the above-discussed with mechanical mice problems has been the development of optical mice. Optical mice have become very popular because they are more robust and may provide a better pointing accuracy.

The dominant conventional technology used for optical mice relies on a light emitting diode (LED) illuminating a surface at grazing incidence, a two-dimensional CMOS (complementary metal-oxide-semiconductor) detector which captures the resultant images, and software that correlates successive images to determine the direction, distance and speed the mouse has been moved. This technology typically provides good accuracy but suffers from low optical efficiency and a relatively high image processing requirements.

Another approach uses one-dimensional arrays of photo-sensors or detectors, such as photodiodes. Successive images of the surface are captured by imaging optics, translated onto the photodiodes, and compared to detect movement of the mouse. The photodiodes may be directly wired in groups to facilitate motion detection. This reduces the photodiode requirements, and enables rapid analog processing. An example of one such a mouse is disclosed in U.S. Pat. No. 5,907,152 to Dandliker et al.

The mouse disclosed in Dandliker et al. differs from the standard technology also in that it uses a coherent light source, such as a laser. Light from a coherent source scattered off of a rough surface generates a random intensity distribution of light known as speckle. The use of a speckle-based pattern has several advantages, including efficient laser-based light generation and high contrast images even under illumination at normal incidence. This allows for a more efficient system and conserves current consumption, which is advantageous in wireless applications so as to extend battery life.

Although a significant improvement over the conventional LED-based optical mice, these speckle-based devices have not been wholly satisfactory for a number of reasons. In particular, mice using laser speckle have not demonstrated the accuracy typically demanded in state-of-the-art mice today, which generally are desired to have a path error of less than 0.5% or thereabout.

The present disclosure discusses and provides solutions to certain problems with prior optical mice and other similar optical pointing devices.

SUMMARY OF THE INVENTION

One embodiment relates to an optical displacement sensor for sensing relative movement between a data input device and a surface by determining displacement of optical features in a succession of frames. The sensor includes at least an illuminator and a detector. The illuminator has a light source and illumination optics to illuminate a portion of the surface. The detector has a plurality of photosensitive elements and imaging optics. The illuminator and the detector are configured such that the illuminated portion of the surface is less than fifty percent larger than a field of view of the photosensitive elements of the detector.

Another embodiment relates to a method of sensing relative movement between a data input device and a surface by determining displacement of optical features in a succession of frames. Illumination is generated from a light source, and the illumination is mapped by illumination optics onto a portion of the surface. Illumination is reflected from the illuminated portion of the surface, and the reflected illumination is mapped by imaging optics onto an arrangement of photosensitive elements in the detector. The illuminated portion of the surface is less than fifty percent larger than a field of view of the photosensitive elements.

Another embodiment relates to an optical displacement sensor for sensing relative movement between a data input device and a surface by determining displacement of optical features in a succession of frames. The sensor includes at least a light source, illumination optics, an arrangement of photosensitive elements, and imaging optics. The illumination optics is adapted to illuminate a portion of the surface in a first shape, and the arrangement of photosensitive elements comprises a second shape similar to the first shape. The imaging optics is adapted to map illumination reflected from the illuminated portion of the surface such that the reflected illumination covers the arrangement of photosensitive elements.

Other embodiments are also disclosed.

BRIEF DESCRIPTION OF THE DRAWINGS

These and various other features and advantages of the present invention be understood more fully from the detailed description that follows and from the accompanying drawings, which however, should not be taken to limit the appended claims to the specific embodiments shown, but are for explanation and understanding only, where:

DETAILED DESCRIPTION

Problems with Illumination Misalignment and Inefficiency

Figure 1A:
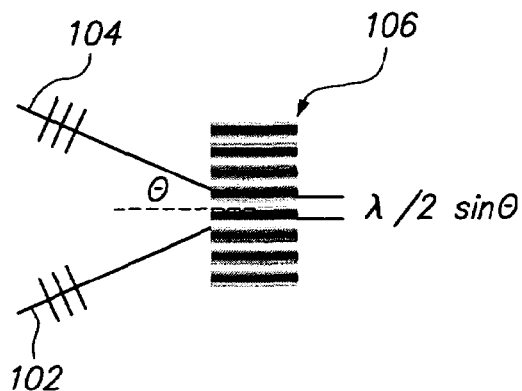
FIGS. 1A and 1B illustrate, respectively, a diffraction pattern of light reflected from a smooth surface and speckle in an interference pattern of light reflected from a rough surface.

One problem with prior speckle-based optical positioning devices is the potential for misalignment of the reflected illumination with the detector so as to cover the entire photodiode array of the detector. In order to reliably cover the entire detector array, prior OPDs have typically been configured to illuminate a much larger portion of the image plane than the field of view of the detector so as to ensure that the photodiode array is fully covered by the reflected illumination in spite of potential misalignment problems.

However, having a large illuminated area reduces the power intensity of the reflected illumination that the photodiodes detect. Thus, attempts to solve or avoid misalignment problems in prior OPDs have frequently resulted in a loss of reflected light available to the photodiode array, or have imposed higher requirements on the illumination power.

As discussed in detail below, one aspect of the present invention discloses a solution to the above-discussed problems of illumination misalignment and inefficiency.

OPD Embodiments Disclosed Herein

The present disclosure relates generally to a sensor for an Optical Positioning Device (OPD), and to methods for sensing relative movement between the sensor and a surface based on displacement of a random intensity distribution pattern of light, known as speckle, reflected from the surface. OPDs include, but are not limited to, optical mice or trackballs for inputting data to a personal computer.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification do not necessarily all refer to the same embodiment.

Generally, the sensor for an OPD includes an illuminator having a light source and illumination optics to illuminate a portion of the surface, a detector having a number of photosensitive elements and imaging optics, and signal processing or mixed-signal electronics for combining signals from each of the photosensitive elements to produce an output signal from the detector.

In one embodiment, the detector and mixed-signal electronics are fabricated using standard CMOS processes and equipment. Preferably, the sensor and method of the present invention provide an optically-efficient detection architecture by use of structured illumination that produces uniform phase-front and telecentric speckle-imaging as well as a simplified signal processing configuration using a combination of analog and digital electronics. This architecture reduces the amount of electrical power dedicated to signal processing and displacement-estimation in the sensor. It has been found that a sensor using the speckle-detection technique, and appropriately configured in accordance with the present invention can meet or exceed all performance criteria typically expected of OPDs, including maximum displacement speed, accuracy, and % path error rates.

Introduction to Speckle-Based Displacement Sensors

This section discusses operating principles of speckle-based displacement sensors as understood and believed by the applicants. While these operating principles are useful for purposes of understanding, it is not intended that embodiments of the present disclosure be unnecessarily limited by these principles.

Referring to FIG. 1A, laser light of a wavelength indicated is depicted as a first incident wave 102 and second incident wave 104 to a surface, each making an angle of incidence θ with respect to the surface normal. A diffraction pattern 106 results which has a periodicity of λ/2 sin θ.

Figure 1B:
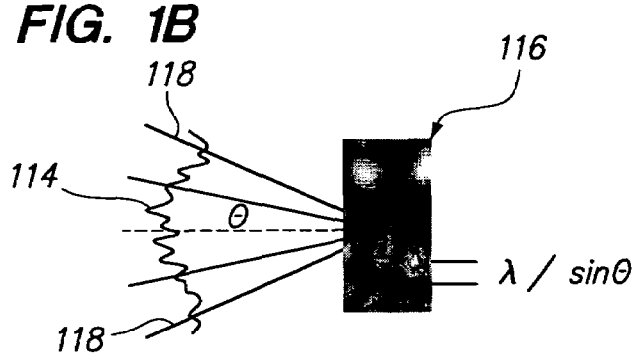

In contrast, referring to FIG. 1B, any general surface with morphological irregularities of dimensions greater than the wavelength of light (i.e. roughly>1 μm) will tend to scatter light 114 into a complete hemisphere in approximately a Lambertian fashion. If a coherent light source, such as a laser is used, the spatially coherent, scattered light will create a complex interference pattern 116 upon detection by a square-law detector with finite aperture. This complex interference pattern 116 of light and dark areas is termed speckle. The exact nature and contrast of the speckle pattern 116 depends on the surface roughness, the wavelength of light and its degree of spatial-coherence, and the light-gathering or imaging optics. Although often highly complex, a speckle pattern 116 is distinctly characteristic of a section of any rough surface that is imaged by the optics and, as such, may be utilized to identify a location on the surface as it is displaced transversely to the laser and optics-detector assembly.

Speckle is expected to come in all sizes up to the spatial frequency set by the effective aperture of the optics, conventionally defined in term of its numerical aperture NA=sin θ as shown FIG. 1B. Following Goodman [J. W. Goodman, "Statistical Properties of Laser Speckle Patterns" in "Laser Speckle and Related Phenomena" edited by J. C. Dainty, Topics in Applied Physics volume 9, Springer-Verlag (1984)—in particular, see pages 39-40], the size statistical distribution is expressed in terms of the speckle intensity auto-correlation. The "average" speckle diameter may be defined as $$a = \frac{\lambda}{\sin\theta} = \frac{\lambda}{NA} \qquad \text{(Equation 1)}$$

where $\lambda$ is the wavelength of the coherent light.

It is interesting to note that the spatial frequency spectral density of the speckle intensity, which by Wiener-Khintchine theorem, is simply the Fourier transform of the intensity auto-correlation. The finest possible speckle, $\alpha_{min} = \lambda/2NA$, is set by the unlikely case where the main contribution comes from the extreme rays 118 of FIG. 1B (i.e. rays at $\pm\theta$), and contributions from most "interior" rays interfere destructively. The cut-off spatial frequency is therefore $f_{co} = 1/(\lambda/2NA)$ or $2NA/\lambda$.

Note that the numerical aperture may be different for spatial frequencies in the image along one dimension (say "x") than along the orthogonal dimension ("y"). This may be caused, for instance, by an optical aperture which is longer in one dimension than another (for example, an ellipse instead of a circle), or by anamorphic lenses. In these cases, the speckle pattern 116 will also be anisotropic, and the average speckle size will be different in the two dimensions.

One advantage of a laser speckle-based displacement sensor is that it can operate with illumination light that arrives at near-normal incidence angles. Sensors that employ imaging optics and incoherent light arriving at grazing incident angles to a rough surface also can be employed for transverse displacement sensing. However, since the grazing incidence angle of the illumination is used to create appropriately large bright-dark shadows of the surface terrain in the image, the system is inherently optically inefficient, as a significant fraction of the light is reflected off in a specular manner away from the detector and thus contributes nothing to the image formed. In contrast, a speckle-based displacement sensor can make efficient use of a larger fraction of the illumination light from the laser source, thereby allowing the development of an optically efficient displacement sensor.

Disclosed Design for Speckle-Based Displacement Sensor

The detailed description below describes an architecture for one such laser-speckle-based displacement sensor using CMOS photodiodes with analog signal combining circuitry, moderate amounts of digital signal processing circuitry, and a low-power light source, such as, for example, a 850 nm Vertical Cavity Surface Emitting Laser (VCSEL). While certain implementational details are discussed in the detailed description below, it will be appreciated by those skilled in the art that different light sources, detector or photosensitive elements, and/or different circuitry for combining signals may be utilized without departing from the spirit and scope of the present invention.

A speckle-based mouse according to an embodiment of the present invention will now be described with reference to FIGS. 2 and 3.

Figure 2:
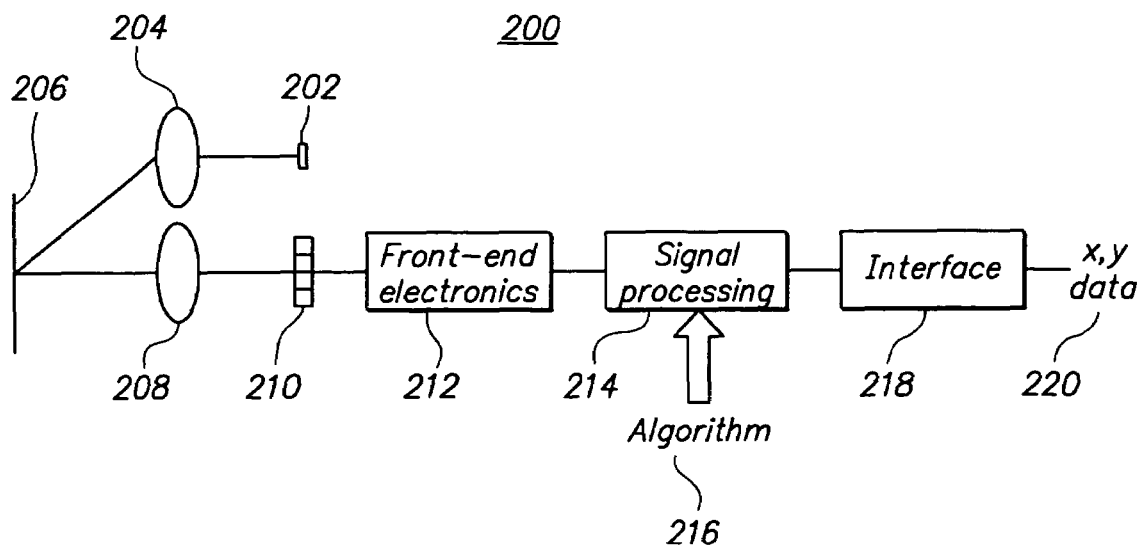
FIG. 2 is a functional block diagram of a speckle-based mouse according to an embodiment of the present invention.

FIG. 2 is functional diagram of a speckle-based system 200 according to an embodiment of the invention. The system 200 includes a laser source 202, illumination optics 204, imaging optics 208, at least two sets of multiple CMOS photodiode arrays 210, front-end electronics 212, signal processing circuitry 214, and interface circuitry 216. The photodiode arrays 210 may be configured to provide displacement measurements along two orthogonal axes, x and y. Groups of the photodiodes in each array may be combined using passive electronic components in the front-end electronics 212 to produce group signals. The group signals may be subsequently algebraically combined by the signal processing circuitry 214 to produce an (x, y) signal providing information on the magnitude and direction of displacement of the OPD in x and y directions. The (x,y) signal may be converted by the interface circuitry 218 to x,y data 220 which may be output by the OPD. Sensors using this detection technique may have arrays of interlaced groups of linear photodiodes known as "differential comb arrays."

Figure 3:
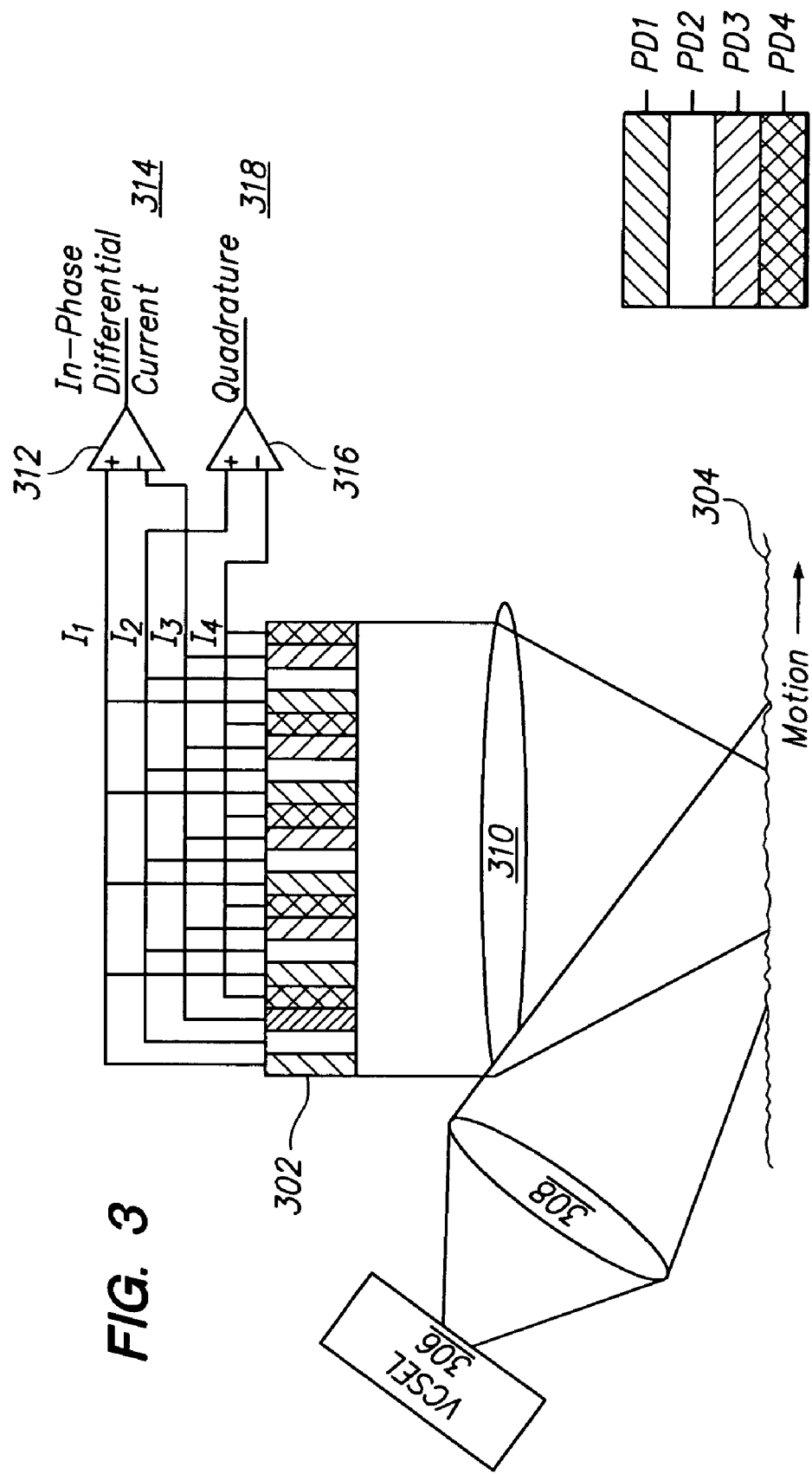
FIG. 3 is a block diagram of a photodiode array according to an embodiment of the present invention.

FIG. 3 shows a general configuration (along one axis) of such a photodiode array 302, wherein the surface 304 is illuminated by a coherent light source, such as a Vertical Cavity Surface Emitting Laser (VCSEL) 306 and illumination optics 308, and wherein the combination of interlaced groups in the array 302 serves as a periodic filter on spatial frequencies of light-dark signals produced by the speckle images.

Speckle generated by the rough surface 304 is mapped to the detector plane with imaging optics 310. Preferably, the imaging optics 310 are telecentric for optimum performance.

In one embodiment, the comb array detection is performed in two independent, orthogonal arrays to obtain estimations of displacements in x and y. A small version of one such array 302 is depicted in FIG. 3.

Each array in the detector consists of a number, N, of photodiode sets, each set having a number, M, of photodiodes (PD) arranged to form an MN linear array. In the embodiment shown in FIG. 3, each set consists of four photodiodes (4 PD) referred to as 1,2,3,4. The PD1s from every set are electrically connected (wired sum) to form a group, likewise PD2s, PD3s, and PD4s, giving four signal lines coming out from the array. Their corresponding currents or signals are $I_1$, $I_2$, $I_3$, and $I_4$. These signals ($I_1$, $I_2$, $I_3$, and $I_4$) may be called group signals. Background suppression (and signal accentuation) is accomplished by using differential analog circuitry 312 to generate an in-phase differential current signal 314 ($I_{13}$)=$I_1$-$I_3$ and differential analog circuitry 316 to generate a quadrature differential current signal 318 ($I_{24}$)=$I_2$-$I_4$. These in-phase and quadrature signals may be called line signals. Comparing the phase of $I_{13}$ and $I_{24}$ permits detection of the direction of motion.

Preferably, to suppress the introduction of phase errors, which can translate directly into displacement error, the sensor of the present invention uses multiple comb arrays. Moreover, although the embodiments described herein use "4N" scheme for the individual arrays, the system design rationale is applicable (with appropriate modifications) for other array configurations or schemes, such as 3N, 5N, 6N, 7N, 8N, and so on. The terminology "4N" refers to a detector array in which every fourth detector is wired together, and the resulting four photocurrent signals are subtracted from each other as described in Dandliker, et al. (U.S. Pat. No. 5,907,152). However, many other groupings are possible with appropriate schemes for combining the signals.

Figure 4:
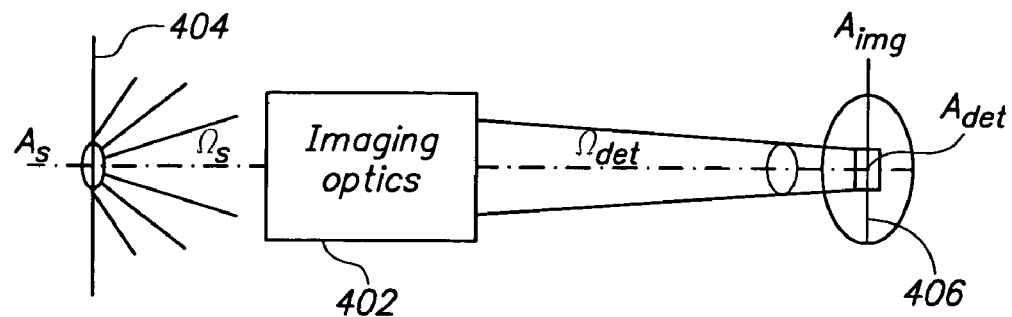
FIG. 4 is a functional block diagram of light collection optics according to an embodiment of the present invention.

An example of imaging or light collection optics 402 is shown generally in FIG. 4. Light is scattered by an area $A_s$ of a surface 404 and imaged onto a detector 406 of area $A_{det}$. For a Lambertian surface, the detector collection efficiency may be expressed as:

$$\eta = 2\eta_{optics} r \frac{A_{det}\Omega_{det}}{A_s\Omega_s} \qquad \text{(Equation 2)}$$

where $\eta_{optics}$ is the efficiency of the optics components (absorption, Fresnel reflections etc.), r the effective surface reflectivity, $\Omega_s$ the solid angle subtended by the surface, and $\Omega_{det}$ the solid angle subtended by the detector.

Shaped Illumination

Applicants believe they have found that one way to maintain good optical efficiency is to custom design the illumination footprint to closely match the detector footprint in size and shape, provided the illumination beam has a planar, or uniform, phase-front. More preferably, the illumination footprint has just sufficient overfill to provide desired margins for minor misalignment arising from operation and fabrication.

Figure 5:
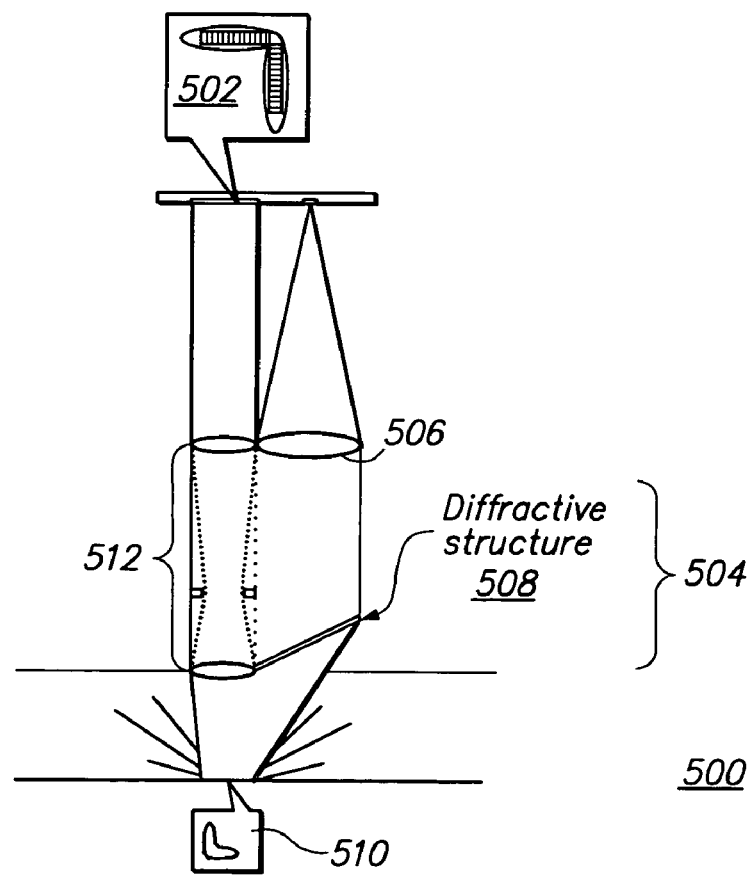
FIG. 5 is an optical diagram showing structured illumination according to an embodiment of the present invention.

One embodiment of such structured illumination is shown in FIG. 5. One feature shown in FIG. 5 is that the illumination falls only on those locations on the optical surface within the field of view (FOV) of the imaging optics. If the geometry of the photodetector array or arrays is an unusual or non-symmetric shape, such as the "L" shaped geometry for the detector arrangement 502 shown in FIG. 5, then the illumination optics 504 should ideally provide light only on that area on the rough surface for optimum optical efficiency. Light that falls on the rough surface outside this FOV area is wasted and reduces the net efficiency of the optical positioning system.

In one implementation, a non-symmetric (i.e. non-circular) shape of the illuminated portion would not be a direct image of the illumination source, but rather would be formed by the configuration of the illumination optics 504. The shape of the illuminated area may even be non-convex. As shown in the example in FIG. 5, the use of standard refractive or reflective optical surfaces 506 combined with diffractive structures 508 allows the creation of a specific illumination spatial profile 510 with planar phase-front to optimally match the FOV required from the imaging optics. The imaging optics 512 is configured to map the specific illumination profile 510 onto the detector arrangement 502 in a way such that the light sensing elements are efficiently covered without covering overly large areas outside the sensing areas. In other words, the optical system 500 of FIG. 5 is configured so as to approximately match the reflected illumination to the shape of the detector arrangement 502 such that light falling outside of the field of view of the detector is minimized. Advantageously, this more efficiently utilizes the power from the light source.

Preferably, the optics is configured so that the illuminated portion of the surface is less than fifty percent (50%) larger than the field of view of the photosensitive elements of the detector. In other words, the reflected illumination preferably covers an area of the detector which is no more than one hundred fifty percent (150%) of the minimum area to cover all the photosensitive elements of the detector. Even more preferably, the optics is configured so that substantially all (for example, 85% or more) of the illuminated portion of the surface falls within the field of view of the photosensitive elements fo the detector.

The specific example illustrated in FIG. 5 shows that the illumination profile 510 may be a mirror image in shape to the reflected illumination which covers the photodetector arrangement 502. This depends upon the configuration of the imaging optics 512.

Figure 6:
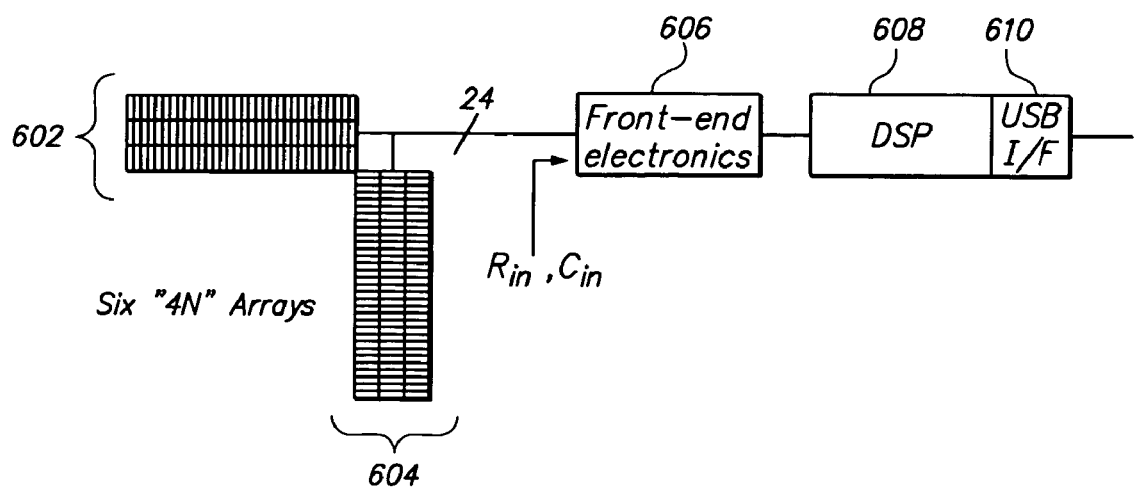
FIG. 6 is a functional block diagram showing two axes of detector elements, each with multiple rows, according to an embodiment of the present invention.

In accordance with a specific embodiment of the invention, a detector configuration may be utilized with multiple interlaced "pixel" (detector element) arrays arranged in parallel rows along two axes, as depicted in FIG. 6. Specifically, FIG. 6 shows three interlaced arrays 602 arranged in parallel rows along an x-axis, and three interlaced arrays 604 arranged in parallel rows along a y-axis.

As discussed above in relation to FIG. 3, each "4N" array consists of four groups of N detector elements which are electrically connected (wired sum), producing four signals $S_1$, $S_2$, $S_3$, $S_4$. Background suppression (and signal accentuation) is done by taking differential signals $S_{13}=S_1-S_3$ and $S_{24}=S_2-S_4$. The amount and the direction of the translation can be deduced from the quadrature pair, $S_{13}$ and $S_{24}$.

In this particular embodiment, the three "4N" arrays (602 and 604) are used for each axis (x and y) so as to suppress phase errors accumulated in the displacements. For this specific embodiment, there are 24 lines (2 axis, 3 arrays/axis, 4 signals/array) that are submitted to the front-end electronics 606, which process the signals and provide input to a digital signal processor 608. The DSP 608 may have, for example, a universal serial bus interface (USB I/F) 610.

Other embodiments may use interlaced detector arrays with M values (i.e. the number of element groupings) which is different from four. Other embodiments may also use different numbers of rows, other than three, per dimension. The number of rows need not be the same in the x and y dimensions.

Figure 7:
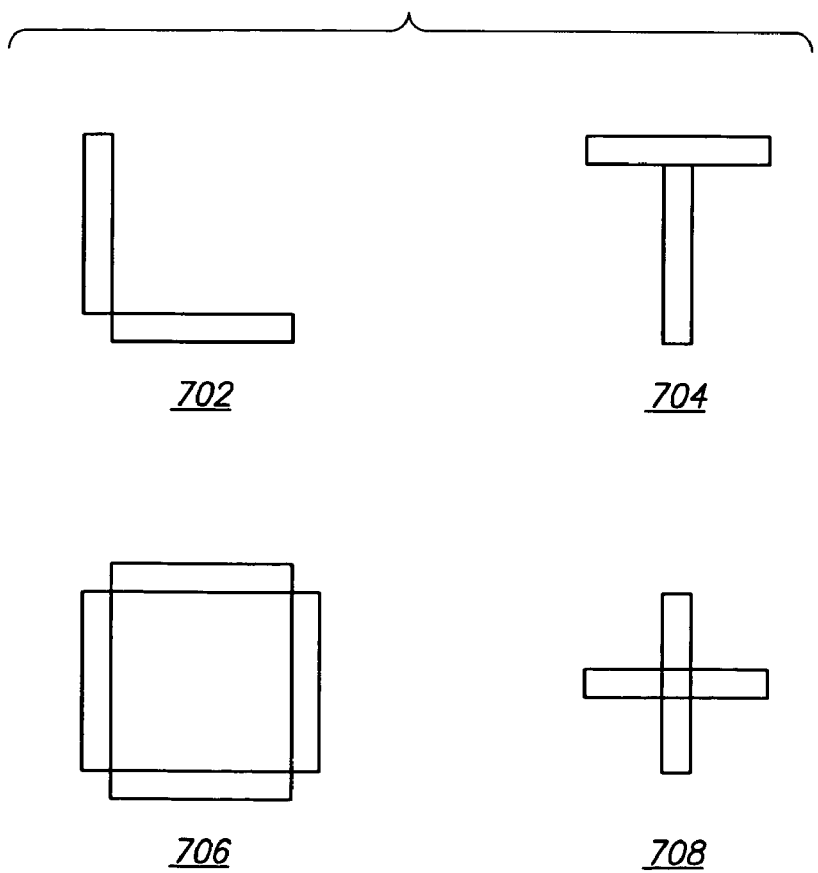
FIG. 7 depicts various arrangements of detector elements according to an embodiment of the present invention.

Other embodiments may be configured with a detector array arrangement which is not in an "L" arrangement 702. Examples of other possible arrangements are shown in FIG. 7, such as a T arrangement 704, a square arrangement 706, and a "+" or "X" arrangement 708. Yet other embodiments may be configured in an arrangement with axes (rows) at a non-perpendicular skew angle, such as a "V" or "Δ" shaped arrangement, for example.

The foregoing description of specific embodiments and examples of the invention have been presented for the purpose of illustration and description, and although the invention has been described and illustrated by certain of the preceding examples, it is not to be construed as being limited thereby. They are not intended to be exhaustive or to limit the invention to the precise forms disclosed, and many modifications, improvements and variations within the scope of the invention are possible in light of the above teaching. It is intended that the scope of the invention encompass the generic area as herein disclosed, and by the claims appended hereto and their equivalents.

What is claimed is:

1. An optical displacement sensor for sensing relative movement between a data input device and a surface by determining displacement of optical features in a succession of frames, the sensor comprising:
    an illuminator having a light source configured to originate an illumination beam and illumination optics configured to transform the illumination beam to a non-circular shape and further configured to illuminate a non-circular portion of the surface by the non-circular-shaped illumination beam, wherein the non-circular-shaped illumination beam has a substantially planar phase-front; and
    a detector having a plurality of photosensitive elements in a non-circular arrangement and imaging optics configured to receive non-circular-shaped illumination reflected from the surface and to image the reflected non-circular-shaped illumination onto the non-circular arrangement of photosensitive elements,
    wherein the plurality of photosensitive elements includes a first plurality of photosensitive elements arranged in substantially straight line along a first axis, and a second plurality of photosensitive elements arranged in substantially straight line along a second axis, and wherein the second axis is non-parallel to the first axis.

2. The optical displacement sensor according to claim 1, wherein the illumination optics comprise diffractive and refractive optics to minimize light falling outside of the field of view of the detector.

3. The optical displacement sensor according to claim 1, wherein the second axis is at an angle to the first axis of about 90 degrees.

4. The optical displacement sensor according to claim 1, wherein the first and second plurality of photosensitive elements are arranged along the first axis and the second axis to form an 'L', 'T', '+', 'X', or 'V' shaped non-circular arrangement, and wherein the reflected non-circular-shaped illumination is of a substantially similar shape as said non-circular arrangement of photosensitive elements.

5. The optical displacement sensor according to claim 4, wherein the illuminator is further configured such that the illuminated portion of the surface defines a corresponding 'L', 'T', '+', 'X', or 'V' shape on the surface.

6. The optical displacement sensor according to claim 1, wherein the illuminator is further configured such that the illuminated non-circular portion of the surface corresponds in shape and area to the field of view of the non-symmetric arrangement of photosensitive elements of the detector.

7. The optical displacement sensor according to claim 1, wherein the illuminator is further configured such that the illuminated portion of the surface is sufficiently larger than field of view of the detector to provide a predetermined margin for errors in operation and fabrication of optical displacement sensor components, and wherein the illuminated non-circular portion of the surface is less than fifty percent more than the field of view of the non-circular arrangement of photosensitive elements of the detector.

8. The optical displacement sensor according to claim 1, wherein the photosensitive elements comprise photodiodes, and the light source comprises a laser.

9. The optical displacement sensor according to claim 1, wherein the optical displacement sensor is a speckle-based displacement sensor adapted to identify a location on the surface based on a complex interference pattern created by light reflected from the surface, and wherein the laser comprises a Vertical Cavity Surface Emitting Laser (VCSEL).

10. The optical displacement sensor according to claim 1, wherein the illuminator and the detector are configured such that substantially all of the illuminated non-circular portion of the surface falls within the field of view of the non-circular arrangement of photosensitive elements.

11. A method of sensing relative movement between a data input device and a surface by determining displacement of optical features in a succession of frames, the method comprising:

generating illumination from a light source;

mapping the illumination by illumination optics onto a non-circular portion of the surface such that the illumination beam has a substantially planar phase-front;

reflecting non-circular-shaped illumination from the illuminated non-circular portion of the surface; and mapping the reflected non-circular-shaped illumination by imaging optics onto a corresponding non-circular arrangement of photosensitive elements in the detector, wherein the illuminated non-circular portion of the surface is less than fifty percent larger than a field of view of the non-circular arrangement of photosensitive elements, wherein a first plurality of the photosensitive elements are arranged in a substantially straight line along a first axis, and a second plurality of the photosensitive elements are arranged in a substantially straight line along a second axis, and wherein the second axis is non-parallel to the first axis.

12. The method according to claim 11, wherein mapping the illumination by the illumination optics comprises refracting and diffracting the illumination such that the illuminated non-circular portion of the surface corresponds in shape to the field of view of the non-circular arrangement of photosensitive elements in the detector.

13. The method according to claim 11, wherein the photosensitive elements are arranged non-circularly so as to form a shape from a group of shapes consisting of 'L', 'T', '+', 'X', and 'V' shapes, and wherein the illuminated non-symmetric portion of the surface forms a corresponding shape.

14. The method according to claim 11 wherein mapping the illumination comprises illuminating the non-circular portion of the surface to define an 'L', 'T', '+', 'X', or 'V' shape on the surface, the illuminated non-circular portion overlapping and corresponding in shape to the field of view of the non-circular arrangement of photosensitive elements of the detector.

* * * * *